United States Patent
Kim et al.

(10) Patent No.: US 9,373,821 B2
(45) Date of Patent: Jun. 21, 2016

(54) DISPLAY APPARATUS

(71) Applicant: SAMSUNG DISPLAY CO., LTD., Yongin, Gyeonggi-Do (KR)

(72) Inventors: Soo-Youn Kim, Yongin (KR); Jin-Koo Kang, Yongin (KR); Seung-Hun Kim, Yongin (CN); Hyun-Ho Kim, Yongin (KR); Seung-Yong Song, Yongin (KR); Cheol Jang, Yongin (KR); Sang-Hwan Cho, Yongin (JP); Chung-Sock Choi, Yongin (KR); Sang-Hyun Park, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/316,184

(22) Filed: Jun. 26, 2014

(65) Prior Publication Data

US 2015/0090971 A1  Apr. 2, 2015

(30) Foreign Application Priority Data

Sep. 30, 2013  (KR) .................. 10-2013-0116903

(51) Int. Cl.
*H01L 27/32* (2006.01)
*H01L 51/52* (2006.01)

(52) U.S. Cl.
CPC ........ *H01L 51/5281* (2013.01); *H01L 27/3246* (2013.01); *H01L 51/5253* (2013.01)

(58) Field of Classification Search
CPC .................................................. H01L 27/3211
USPC ......................................................... 257/40
See application file for complete search history.

(56) References Cited

U.S. PATENT DOCUMENTS

| | | | |
|---|---|---|---|
| 2002/0071934 A1* | 6/2002 | Marutsuka | H01J 11/10 428/131 |
| 2005/0179368 A1 | 8/2005 | Ryu et al. | |
| 2006/0158114 A1 | 7/2006 | Moon et al. | |
| 2007/0252155 A1* | 11/2007 | Cok | 257/79 |
| 2008/0160263 A1 | 7/2008 | Cho et al. | |
| 2013/0026134 A1 | 1/2013 | Nakagawa et al. | |
| 2013/0242399 A1* | 9/2013 | Tsuboi et al. | 359/609 |
| 2013/0270118 A1 | 10/2013 | Park et al. | |
| 2013/0299222 A1* | 11/2013 | Lee et al. | 174/258 |

FOREIGN PATENT DOCUMENTS

| KR | 10-2005-0076464 | 7/2005 |
|---|---|---|
| KR | 10-0666525 | 1/2007 |
| KR | 10-0696482 | 3/2007 |
| KR | 20-2012-0080325 | 7/2012 |
| KR | 10-2012-0104339 | 9/2012 |

OTHER PUBLICATIONS

Ogwu et al. The Influence of rf power and oxygen flow rate during deposition, etc., Journal of Physics D: Applied Physics, 38 (2005), pp. 266-271.

* cited by examiner

*Primary Examiner* — Edward Wojciechowicz
(74) *Attorney, Agent, or Firm* — Lee & Morse, P.C.

(57) ABSTRACT

A display apparatus includes a substrate, a display unit, a first metal oxide layer on the display unit, and a second metal oxide layer. The display unit may include an emission region and a non-emission region. The second metal oxide layer may be on the first metal oxide layer in the non-emission region. The first metal oxide layer and the second metal oxide layer may each include a metal oxide, the transparency of which varies according to a degree of oxidization of the metal oxide.

16 Claims, 13 Drawing Sheets

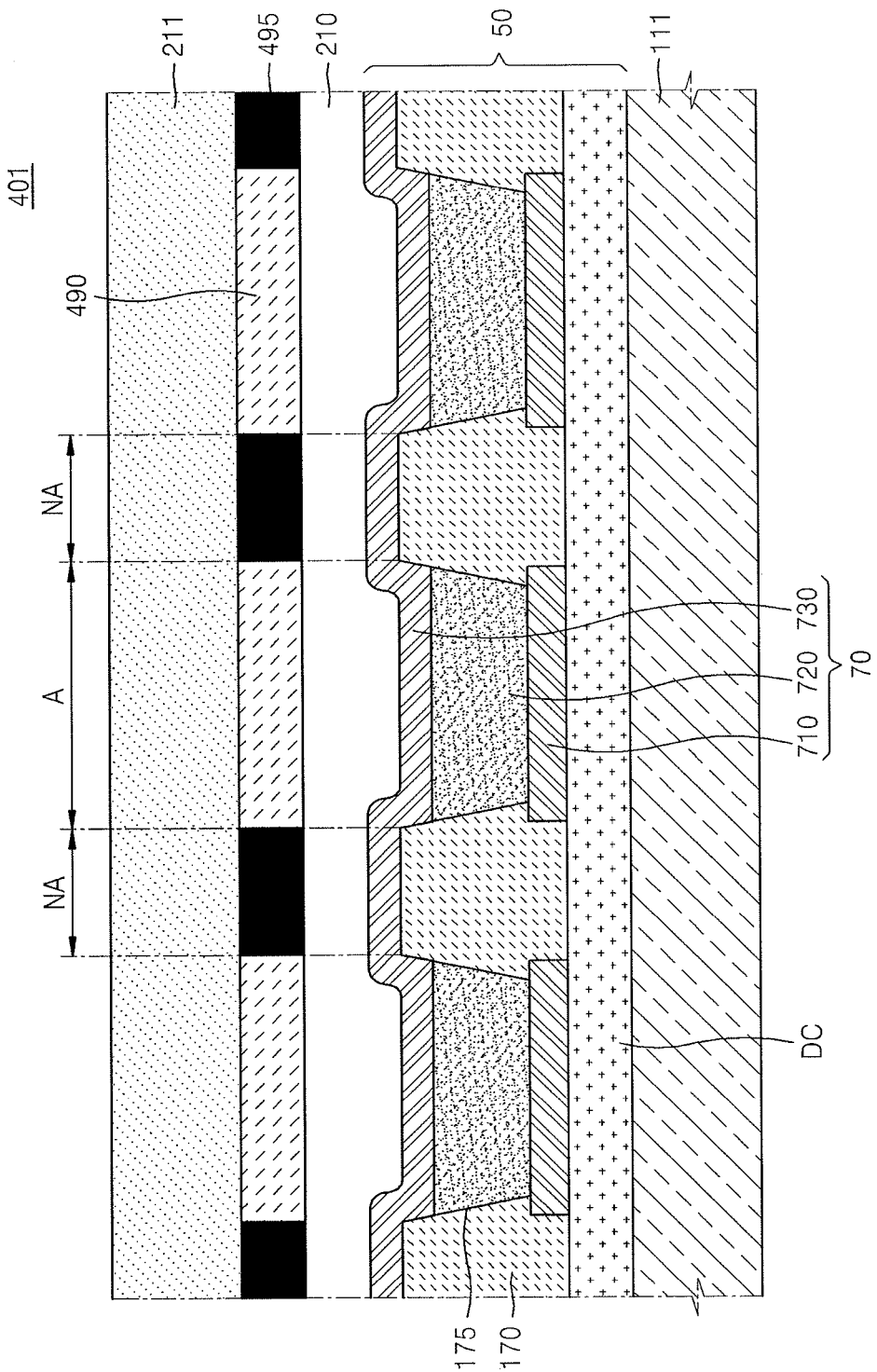

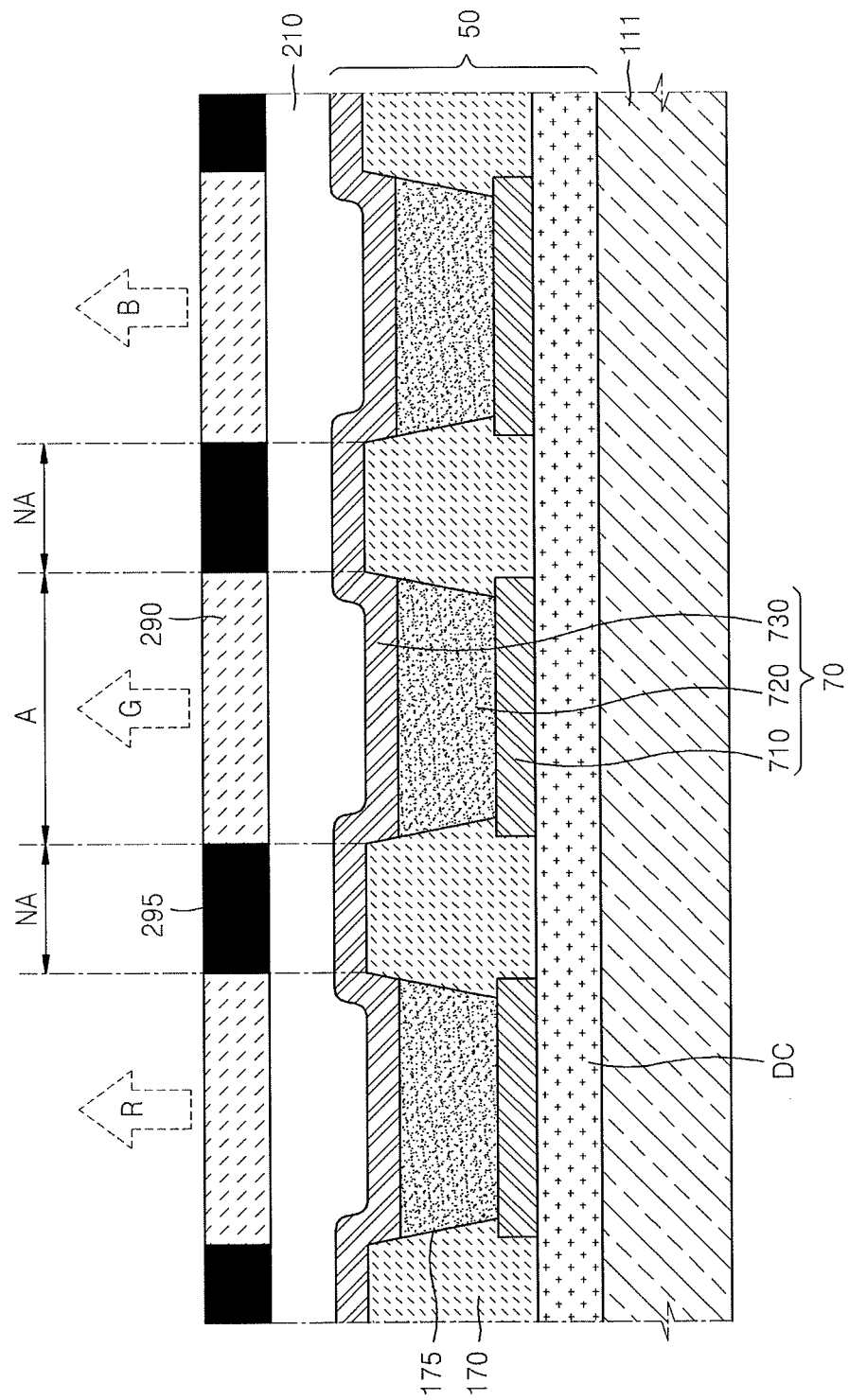

DISPLAY APPARATUS

CROSS-REFERENCE TO RELATED APPLICATION

Korean Patent Application No. 10-2013-0116903, filed on Sep. 30, 2013, in the Korean Intellectual Property Office, and entitled: "Display Apparatus," is incorporated by reference herein in its entirety.

BACKGROUND

1. Field

Embodiments relate to a display apparatus.

2. Description of the Related Art

An organic light-emitting diode display apparatus is a self-emission display apparatus that may display an image using an organic light-emitting device. Light is emitted by energy generated when excitons drop from an excited state to a ground state. However, the organic light-emitting diode display apparatus may have poor black color expression and contrast due to the reflection of external light when the organic light-emitting diode display apparatus is used in a bright place.

SUMMARY

A display apparatus includes a substrate, a display unit, a first metal oxide layer on the display unit, and a second metal oxide layer. The display unit includes an emission region and a non-emission region. The second metal oxide layer is on the first metal oxide layer in the non-emission region. The first metal oxide layer and the second metal oxide layer each include a metal oxide, the transparency of which varies according to a degree of oxidization of the metal oxide.

The first metal oxide layer may be transparent, and the second metal oxide layer may be opaque, or vice versa. The metal oxide may be a copper oxide. The first metal oxide layer may include a first copper oxide represented by $Cu_2O$, and the second metal oxide layer may include a second copper oxide represented by CuO. The display unit may include a pixel defining layer having an opening portion, and the emission region may correspond to the opening portion. The display unit may include an organic light-emitting device (OLED) on the substrate. The OLED may include a first electrode, an intermediate layer, and a second electrode. The display unit may further include a pixel defining layer having an opening portion, and the intermediate layer may be in the opening portion. The display apparatus may further include an encapsulating layer directly on the display unit.

A display apparatus includes a substrate, a display unit on the substrate, a first metal oxide layer, and a second metal oxide layer. The display includes an emission region and a non-emission region. The first metal oxide layer is on the display unit in the emission region. The second metal oxide layer is on the display unit in the non-emission region. The first metal oxide layer and the second metal oxide layer include a metal oxide, the transparency of which varies according to a degree of oxidization. The first metal oxide layer may be transparent, and the second metal oxide layer may be opaque. The metal oxide may be a copper oxide. The first metal oxide layer may include a first copper oxide represented by $Cu_2O$, and the second metal oxide layer may include a second copper oxide represented by CuO. The display unit may include a pixel defining layer having an opening portion, the emission region corresponding to the opening portion. The display unit may include an organic light-emitting device (OLED) on the substrate. The OLED may include a first electrode, an intermediate layer, and a second electrode. The display unit may further include a pixel defining layer having an opening portion, and the intermediate layer may be in the opening portion. The display apparatus may further include an encapsulating layer directly on the display unit.

BRIEF DESCRIPTION OF THE DRAWINGS

Features will become apparent to those of ordinary skill in the art by describing in detail exemplary embodiments with reference to the attached drawings in which:

FIG. 6 illustrates a partial cross-sectional view of a display apparatus;

FIGS. 8A to 8D illustrate schematic cross-sectional views of stages of a method of manufacturing the display apparatus of FIG. 4.

DETAILED DESCRIPTION

Figure 1:
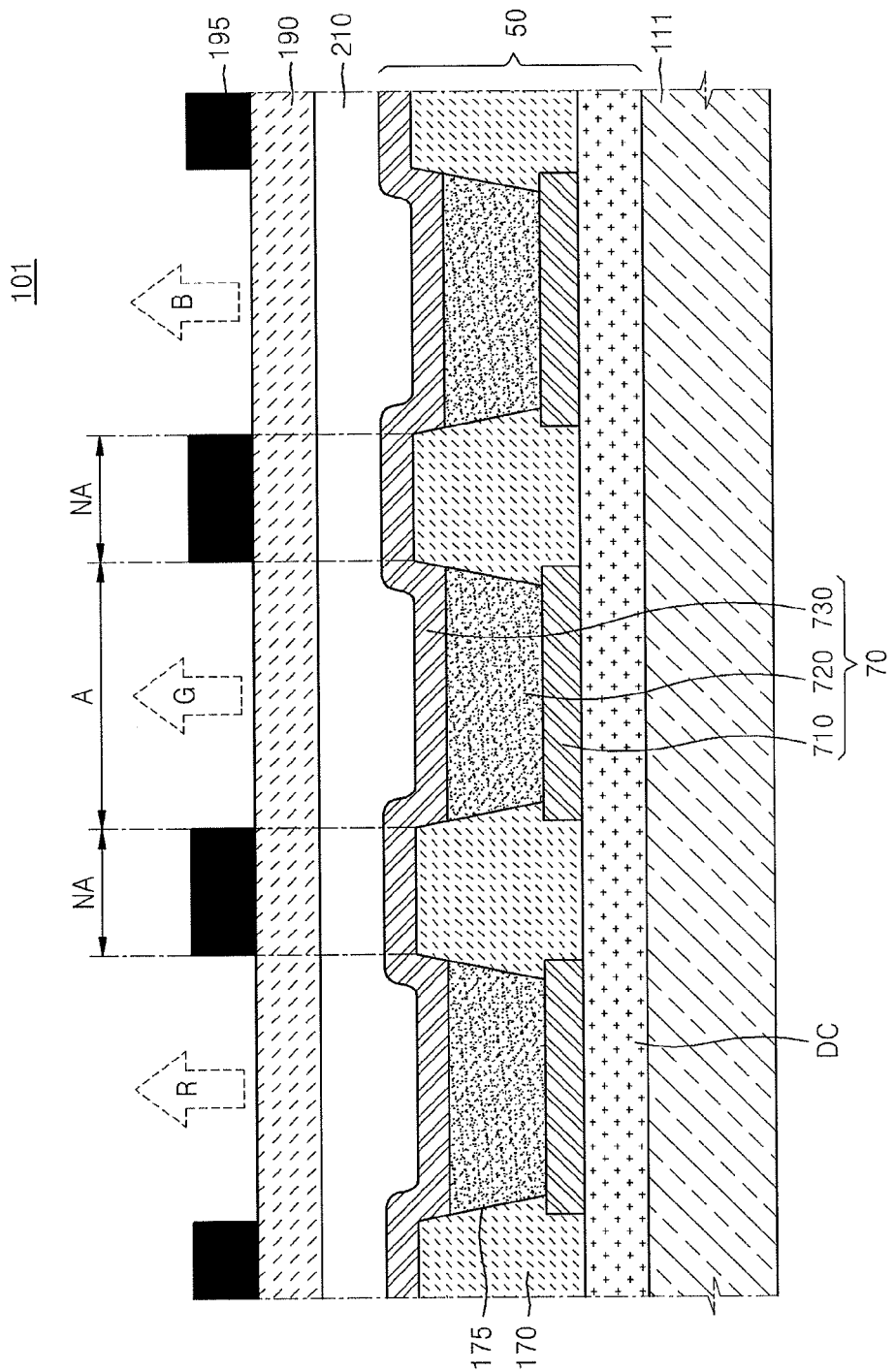
FIG. 1 illustrates a partial cross-sectional view of a display apparatus.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Embodiments are described herein, by referring to the figures, to explain aspects of the present description. Sizes of elements in the drawings may be exaggerated for convenience of explanation. Because sizes and thicknesses of components in the drawings are arbitrarily illustrated for convenience of explanation, the following embodiments are not limited thereto.

Although the terms "first," "second," and the like may be used herein to describe various components, these components should not be limited by these terms. These components are only used to distinguish one component from another. As used herein, the singular forms "a," "an," and "the" are intended to include the plural forms as well, unless the context clearly indicates otherwise. The terms "comprises" and/or "comprising" used herein specify the presence of stated features or components, but do not preclude the presence or addition of one or more other features or components. When a layer, region, or component is referred to as being "on," another layer, region, or component, it can be directly or indirectly on the other layer, region, or component. That is, for example, intervening layers, regions, or components may be present. As used herein, expressions such as "at least one of," when preceding a list of elements, modify the entire list of elements and do not modify the individual elements of the list.

FIG. 1 illustrates a partial cross-sectional view of a display apparatus 101. As shown in FIG. 1, the display apparatus 101 may include a substrate 111, a display unit 50, a first metal oxide layer 190, and a second metal oxide layer 195. The display unit 50 may include an organic light-emitting device (OLED) 70 and a driving circuit unit DC. The substrate 111 may include an insulating substrate made of glass, quartz, or ceramic, or a flexible substrate made of plastic. The substrate 111 may include a metallic substrate made of a stainless steel.

Figure 2:
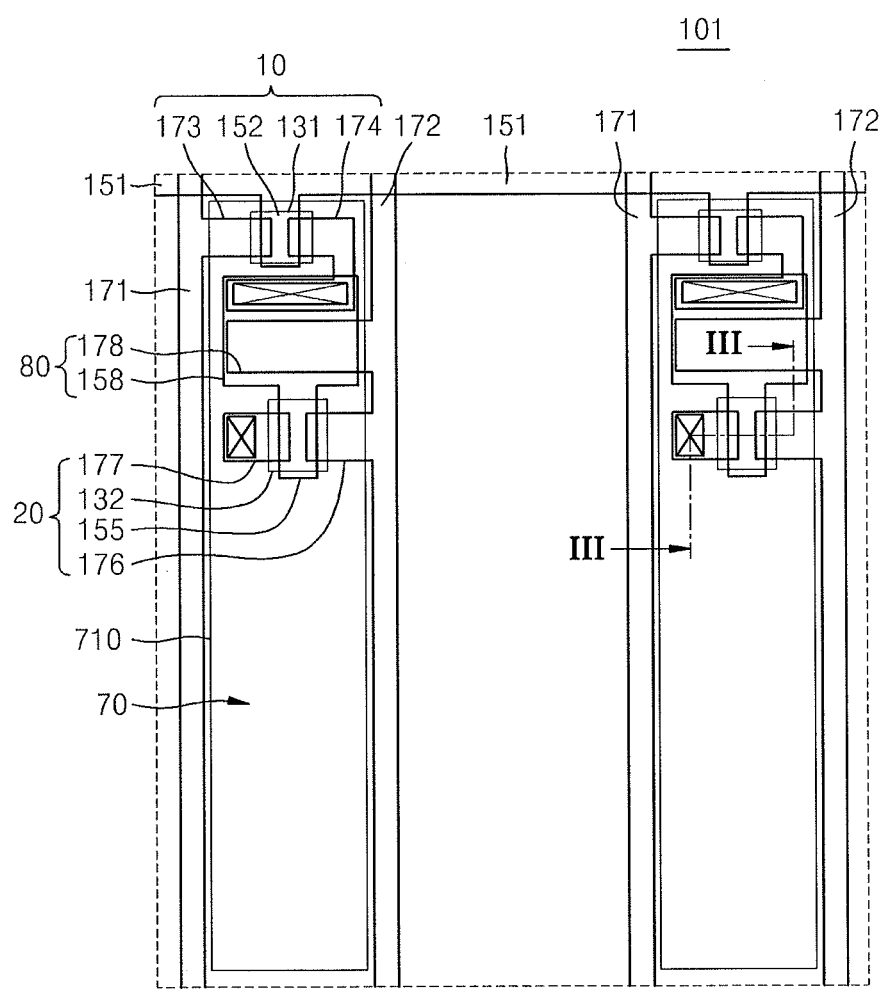
FIG. 2 illustrates an arrangement diagram of a pixel circuit of the display apparatus of FIG. 1.
Figure 3:
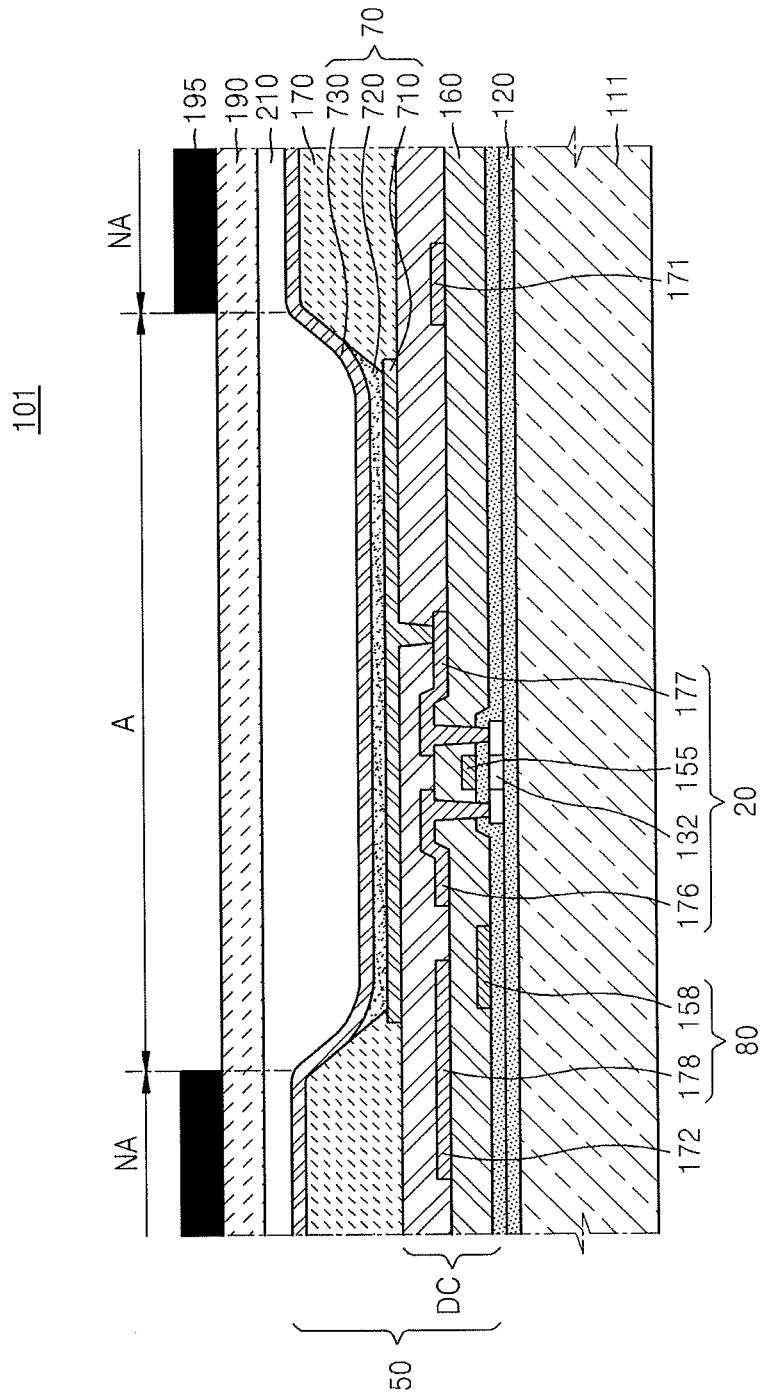
FIG. 3 illustrates a cross-sectional view along line III-III of FIG. 2.

The driving circuit unit DC may be on the substrate 111. The driving circuit unit DC may include thin-film transistors (TFTs) 10 and 20 (shown in FIG. 2), a capacitor 80 (shown in FIG. 2), and the like. The driving circuit unit DC may drive the OLED 70. The OLED 70 may display an image by emitting light according to a driving signal received from the driving circuit unit DC. A detailed structure of the driving circuit unit DC is illustrated in FIGS. 2 and 3, as an example embodiment. The driving circuit unit DC may have various structures within the scope, which may be variously modified.

The OLED 70 may include a first electrode 710, an intermediate layer 720, and a second electrode 730. The first electrode 710 may be, for example, an anode electrode that is a hole injection electrode, and the second electrode 730 may be, for example, a cathode electrode that is an electron injection electrode. The first electrode 710 may be an anode electrode, and the second electrode 730 may be a cathode electrode.

The intermediate layer 720 may include, for example, an organic emission layer. The intermediate layer 720 may include, for example, the organic emission layer and may further include at least one selected from a hole injection layer (HIL), a hole transport layer (HTL), an electron transport layer (ETL), and an electron injection layer (EIL). The present embodiment may include the organic emission layer and further include other various functional layers.

The display apparatus 101 may further include a pixel defining layer 170 having an opening portion 175 that exposes at least a portion of the first electrode 710 therethrough. The intermediate layer 720 may emit light in the opening portion 175 of the pixel defining layer 170. The opening portion 175 of the pixel defining layer 170 may define an emission region A in which light is emitted. A region in which the opening portion 175 of the pixel defining layer 170 is may be referred to as the emission region A. A region except for the region in which the pixel defining layer 170 is located, i.e., the emission region A, may be referred to as a non-emission region NA.

An encapsulating layer 210 may face the substrate 111 and may cover the OLED 70 and the driving circuit unit DC. The encapsulating layer 210 may include a plurality of inorganic layers or may include an inorganic layer and an organic layer. The organic layer of the encapsulating layer 210 may include a polymer and may be a single layer or a stacked layer. The organic layer may include one or more of polyethylene terephthalate, polyimide, polycarbonate, epoxy, polyethylene, and polyacrylate. The organic layer may include polyacrylate. For example, the organic layer may include a polymerized monomer composition including a diacrylate-based monomer and a triacrylate-based monomer. The monomer composition may further include a monoacrylate-based monomer. The monomer composition may further include, for example, a suitable photoinitiator such as trimethyl benzoyl diphenyl phosphine oxide (TPO).

The inorganic layer of the encapsulating layer 210 may be a single layer or a layer stack including a metal oxide or a metal nitride. The inorganic layer may include one or more of silicon nitride ($SiN_x$), aluminum oxide ($Al_2O_3$), silicon oxide ($SiO_2$), and titanium oxide ($TiO_2$).

The top layer of the encapsulating layer 210 that is exposed to the outside may include an inorganic layer in order to prevent intrusion of moisture into the OLED 70. The encapsulating layer 210 may include at least one sandwich structure in which at least one organic layer is between at least two inorganic layers. The encapsulating layer 210 may include at least one sandwich structure in which at least one inorganic layer is between at least two organic layers. The encapsulating layer 210 may include at least one sandwich structure in which at least one organic layer is between at least two inorganic layers and at least one sandwich structure in which at least one inorganic layer is between at least two organic layers.

The encapsulating layer 210 may include a first inorganic layer, a first organic layer, and a second inorganic layer sequentially arranged from the top portion of the OLED 70. The encapsulating layer 210 may include the first inorganic layer, the first organic layer, the second inorganic layer, a second organic layer, and a third inorganic layer sequentially arranged from the top portion of the OLED 70. The encapsulating layer 210 may include the first inorganic layer, the first organic layer, the second inorganic layer, the second organic layer, the third inorganic layer, a third organic layer, and a fourth inorganic layer sequentially arranged from the top portion of the OLED 70.

A halogenated metal layer including lithium fluoride (LiF) may be further included between the OLED 70 and the first inorganic layer. The halogenated metal layer may prevent damage to the OLED 70 when the first inorganic layer is formed by a sputtering method or a plasma deposition method.

The first organic layer may be smaller than the second inorganic layer, and the second organic layer may be smaller than the third inorganic layer. The first organic layer may be completely covered by the second inorganic layer, and the second organic layer may also be completely covered by the third inorganic layer.

The first metal oxide layer 190 may be on the encapsulating layer 210. The first metal oxide layer 190 may be entirely on the encapsulating layer 210. The first metal oxide layer 190 may include a metal oxide, transparency of which may vary according to a degree of oxidization. The first metal oxide layer 190 may include a copper oxide or a molybdenum oxide. The first metal oxide layer 190 may include a copper oxide ($Cu_2O$). The first metal oxide layer 190 may be transparent. The first metal oxide layer 190 may allow light of the emission region A to pass therethrough.

The second metal oxide layer 195 may be on the first metal oxide layer 190. The second metal oxide layer 195 may be in the non-emission region NA. The second metal oxide layer 195 may be on the pixel defining layer 170. The second metal oxide layer 195 may include a metal oxide, the transparency of which may vary according to a degree of oxidization. The second metal oxide layer 195 may include an oxide of the same metal as the first metal oxide layer 190 with a different degree of oxidization. The second metal oxide layer 195 may have transparency that is different from that of the first metal oxide layer 190. The second metal oxide layer 195 may include a copper oxide (CuO). The second metal oxide layer 195 may be opaque. The second metal oxide layer 195 may be patterned in the non-emission region NA, thereby increasing extinction and decreasing reflection in the non-emission region NA while maintaining the transmissivity of the emission region A. The recognition property of the display apparatus 101 may be improved. A sum of heights of the first metal oxide layer 190 and the second metal oxide layer 195 may be within several μm. Accordingly, the thickness of the display apparatus 101 may be reduced, thereby improving the external appearance thereof.

An internal structure of the display apparatus 101 will now be described with reference to FIGS. 2 and 3. FIG. 2 illustrates an arrangement diagram illustrating a structure of a pixel, and FIG. 3 illustrates a cross-sectional view along line III-III of FIG. 2. The pixel may be a minimum unit for displaying an image in the display apparatus 101. A unit pixel may include a plurality of sub-pixels that may emit lights of various colors. For example, the sub-pixels may include sub-pixels that emit lights of red, green, and blue colors or sub-pixels that emit lights of red, green, blue, and white colors. The sub-pixels may include intermediate layers 720 having organic emission layers that emit light of various colors. For example, the sub-pixels may include intermediate layers 720 having organic emission layers that emit light of red, green, and blue colors. The sub-pixels that emit light of various colors may include intermediate layers 720 that emit light of the same color, for example, white, and may include a color converting layer or a color filter that coverts the white light into a light of a predetermined color.

The intermediate layer 720 emitting the white light may have a variety of structures, for example, a structure in which at least a light-emitting substance emitting a red light, a light-emitting substance emitting a green light, and a light-emitting substance emitting a blue light are stacked on one another. In another example for emitting the white light, the intermediate layer 720 may include a structure in which at least a light-emitting substance emitting a red light, a light-emitting substance emitting a green light, and a light-emitting substance emitting a blue light are mixed. The red, greed, and blue colors are exemplary, and any combination and/or number of same or other various colors that is capable of emitting a white light, may be employed in addition or in the alternative to a combination of red, green, and blue colors.

Although FIGS. 2 and 3 show a 2Tr-1Cap-structure active matrix (AM) display apparatus 101 having two TFTs 10 and 20 (a switching TFT 10 and a driving TFT 20) and one capacitor 80 in one pixel, the number of TFTs and/or capacitors may be varied. For example, the display apparatus 101 may have three or more TFTs and two or more capacitors in one pixel or may have various structures with additional separate wirings. The pixel is a minimum unit for displaying an image and may be located in every pixel region. The display apparatus 101 may display an image through a plurality of pixels.

As shown in FIGS. 2 and 3, the display apparatus 101 may include, for example, the switching TFT 10, the driving TFT 20, the capacitor 80, and the OLED 70 in every pixel. A configuration including the switching TFT 10, the driving TFT 20, and the capacitor 80 may be referred to as the driving circuit unit DC. The display apparatus 101 may further include a gate line 151 arranged along one direction, a data line 171 insulation-crossing the gate line 151, and a common power line 172. One pixel may be defined, for example, by a boundary of the gate line 151, the data line 171, and the common power line 172. Other suitable boundaries may be used to define a pixel.

The OLED 70 may include the first electrode 710, the intermediate layer 720 on the first electrode 710, and the second electrode 730 on the intermediate layer 720. Holes and electrons may be respectively injected from the first electrode 710 and the second electrode 730 into the intermediate layer 720. Light may be emitted when excitons generated by bonding the injected electrons and holes drop from an excited state to a ground state.

The capacitor 80 may include a pair of condensing plates 158 and 178 with an interlayer insulating layer 160 therebetween. The interlayer insulating layer 160 may be a dielectric. A capacitance may be determined by charges accumulated in the capacitor 80 and a voltage applied between the pair of condensing plates 158 and 178. One or more buffer layer 120 may be situated between the interlayer insulating layer 160 and the substrate 111.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177. The switching semiconductor layer 131 and the driving semiconductor layer 132 may include a variety of materials. For example, the switching semiconductor layer 131 and the driving semiconductor layer 132 may include an inorganic semiconductor material, such as amorphous silicon or crystalline silicon. The switching semiconductor layer 131 and the driving semiconductor layer 132 may include an oxide semiconductor material. The switching semiconductor layer 131 and the driving semiconductor layer 132 may include an organic semiconductor material.

The switching TFT 10 may be used as a switching device for selecting a pixel by which light is to be emitted. The switching gate electrode 152 may be connected to the gate line 151. The switching source electrode 173 may be connected to the data line 171. The switching drain electrode 174 may be positioned away from the switching source electrode 173 and may be connected to any one condensing plate 158.

The driving TFT 20 may apply to the first electrode 710 driving power for causing the intermediate layer 720 of the OLED 70 in the selected pixel to emit light. The driving gate electrode 155 may be connected to the condensing plate 158 to which the switching drain electrode 174 may be connected. The driving source electrode 176 and the other condensing plate 178 may be connected to the common power line 172. The driving drain electrode 177 may be connected to the first electrode 710 of the OLED 70 through a contact hole.

The switching TFT 10 may operate by a gate voltage applied through the gate line 151 and may function to deliver a data voltage applied through the data line 171 to the driving TFT 20. A voltage corresponding to a difference between a common voltage applied from the common power line 172 to the driving TFT 20 and the data voltage delivered from the switching TFT 10 may be stored in the capacitor 80, and a current corresponding to the voltage stored in the capacitor 80 may flow to the OLED 70 through the driving TFT 20 to thereby cause the OLED 70 to emit light. Although an embodiment where the display unit 50 including the OLED 70 has been described, the embodiment may be applied to display apparatuses including various types of display units 50, e.g., a display unit 50 including a liquid crystal device.

Figure 4:
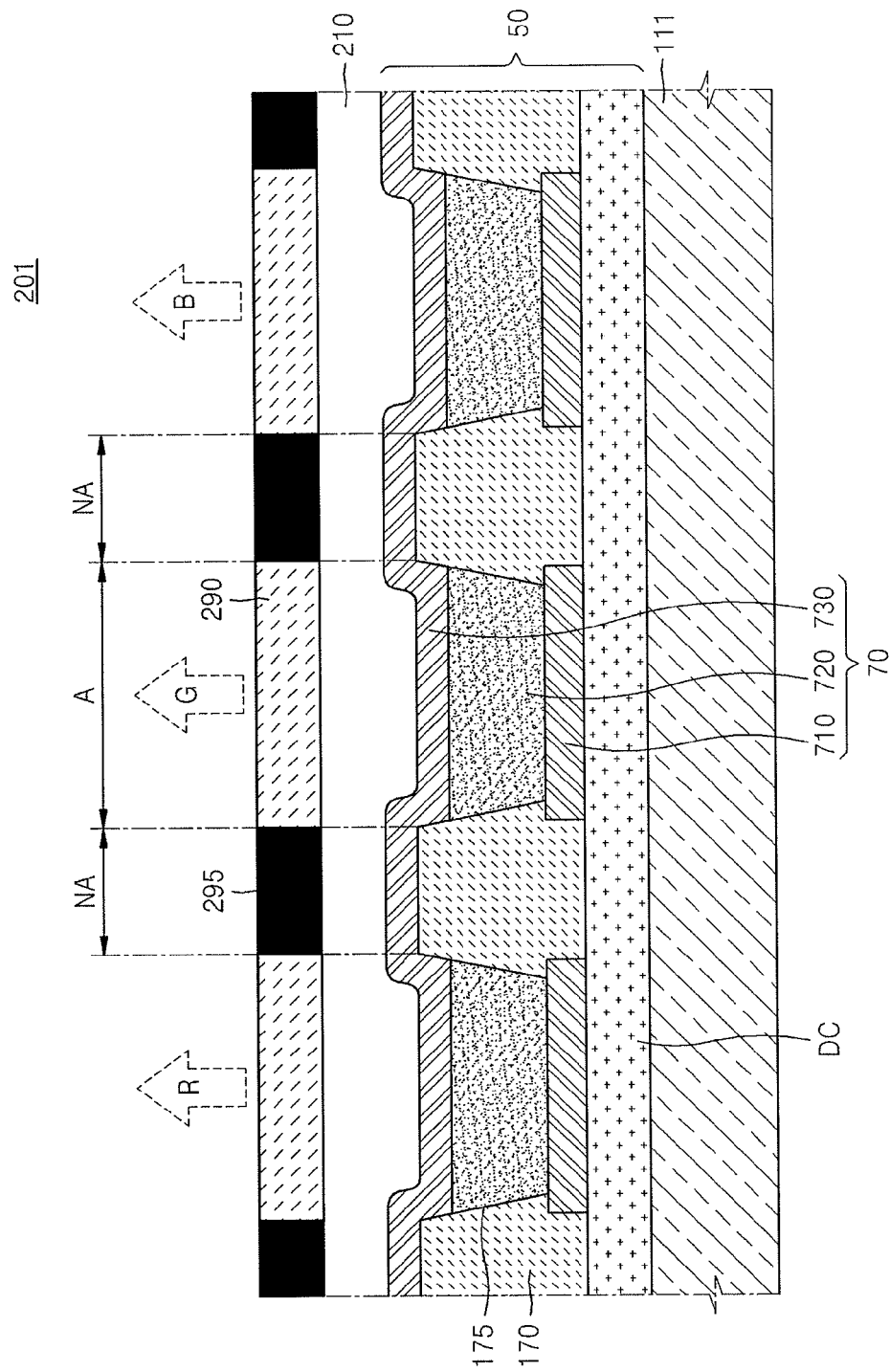
FIG. 4 illustrates a partial cross-sectional view of a display apparatus.

FIG. 4 illustrates a partial cross-sectional view of a display apparatus 201. Hereinafter, the present embodiment will be described mainly with respect to differences with the embodiment of FIG. 1. Referring to FIG. 4, the display apparatus 201 may include the substrate 111, the display unit 50, a first metal oxide layer 290, and a second metal oxide layer 295. The display unit 50 may include the OLED 70 and the driving circuit unit DC. The encapsulating layer 210 may be oriented to face the substrate 111 and may cover the OLED 70 and the driving circuit unit DC. The encapsulating layer 210 may include a plurality of inorganic layers or include an inorganic layer and an organic layer.

The first metal oxide layer 290 may be on the encapsulating layer 210. The first metal oxide layer 190 may be patterned in the emission region A. The first metal oxide layer 290 may include a metal oxide, the transparency of which may vary according to a degree of oxidization. The first metal oxide layer 290 may include a copper oxide or a molybdenum oxide. The first metal oxide layer 290 may include $Cu_2O$. The first metal oxide layer 290 may be transparent. The first metal oxide layer 290 may allow light of the emission region A to pass therethrough.

The second metal oxide layer 295 may be patterned in the non-emission region NA. The second metal oxide layer 295 may be on the pixel defining layer 170. The second metal oxide layer 295 may include a metal oxide, the transparency of which may vary according to a degree of oxidization. The second metal oxide layer 295 may include an oxide of the same metal as the first metal oxide layer 290 with a different degree of oxidization. The second metal oxide layer 295 may have transparency that is different from that of the first metal oxide layer 290.

The second metal oxide layer 295 may include CuO. The second metal oxide layer 295 may be opaque. The second metal oxide layer 295 may be patterned in the non-emission region NA, thereby increasing extinction and decreasing reflection in the non-emission region NA while maintaining the transmissivity of the emission region A. The recognition property of the display apparatus 201 may be improved. A total height of the first metal oxide layer 190 and the second metal oxide layer 195 may be within several μm. The thickness of the display apparatus 201 may be reduced, thereby improving the external appearance thereof.

Figure 5:
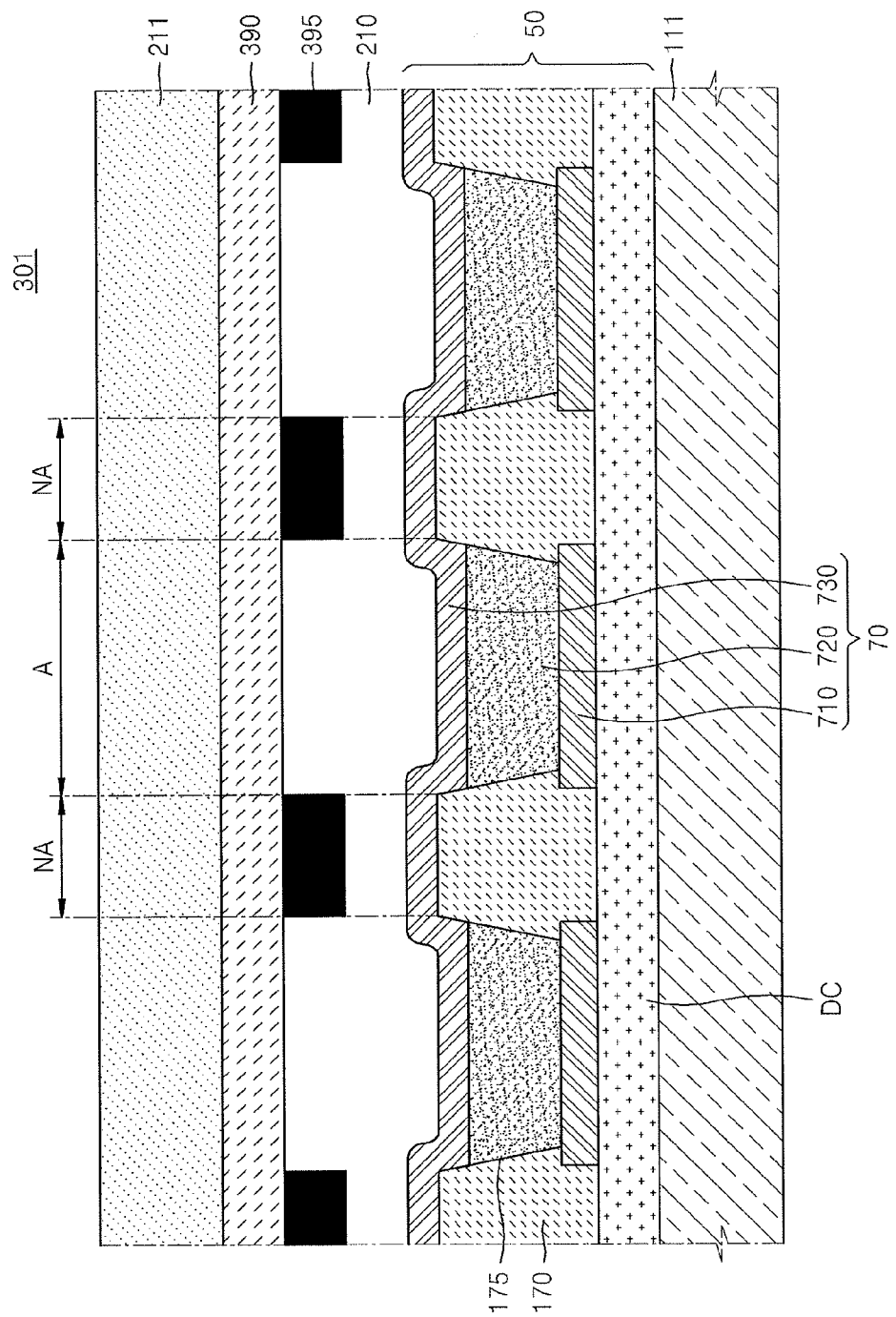
FIG. 5 illustrates a partial cross-sectional view of a display apparatus.

FIG. 5 illustrates a partial cross-sectional view of a display apparatus 301. FIG. 6 illustrates a partial cross-sectional view of a display apparatus 401. Hereinafter, the present embodiments will be described mainly with differences with respect to the embodiments of FIGS. 1 and 4. Referring to FIG. 5, the display apparatus 301 may include the substrate 111, the display unit 50, a first metal oxide layer 390, and a second metal oxide layer 395, and an encapsulating substrate 211. For example, the encapsulating substrate 211 and the second metal oxide layer 395 may be on either side of the first metal oxide layer 390. The encapsulating layer 210 may be between the first metal oxide layer 390 and the second electrode 730, as well as being between portions of the second metal oxide layer 395. The display apparatus 301 according to the present embodiment differs from the embodiment of FIG. 1 in that the first metal oxide layer 390 and the second metal oxide layer 395 are applied to the encapsulating substrate 211.

Referring to FIG. 6, the display apparatus 401 may include the substrate 111, the display unit 50, a first metal oxide layer 490, and a second metal oxide layer 495, and the encapsulating substrate 211. The display apparatus 401 according to the present embodiment differs from the embodiment of FIG. 2 in that the first metal oxide layer 490 and the second metal oxide layer 495 are applied to the encapsulating substrate 211. For example, the first metal oxide layer 490 and the second metal oxide layer 495 may lie in a common stratum, occurring alternatingly and adjacent to one another in the common stratum. The first metal oxide layer 490 and the second metal oxide layer 495 may between the encapsulating substrate 211 and the encapsulating layer 210.

Figure 7A:
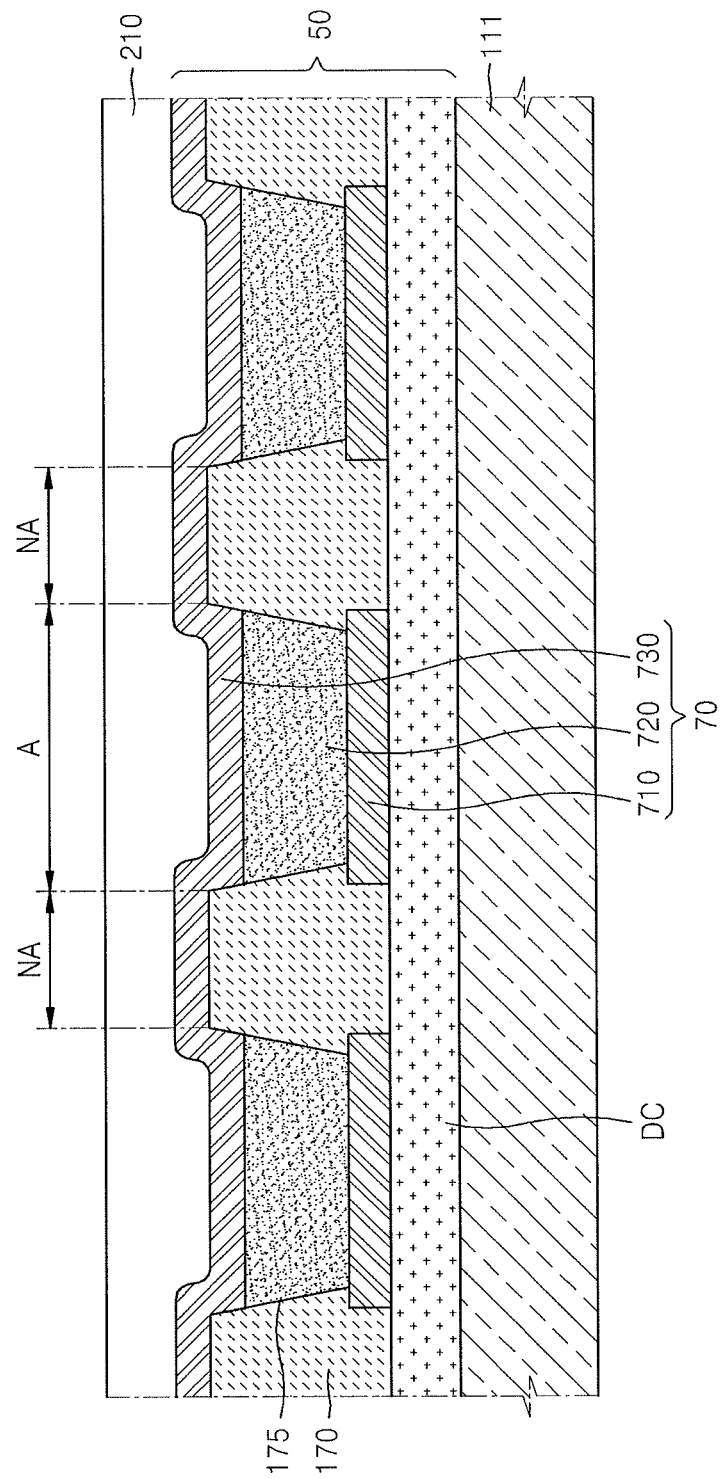
FIGS. 7A to 7C illustrate schematic cross-sectional views of stages of a method of manufacturing the display apparatus of FIG. 1.
Figure 7B:
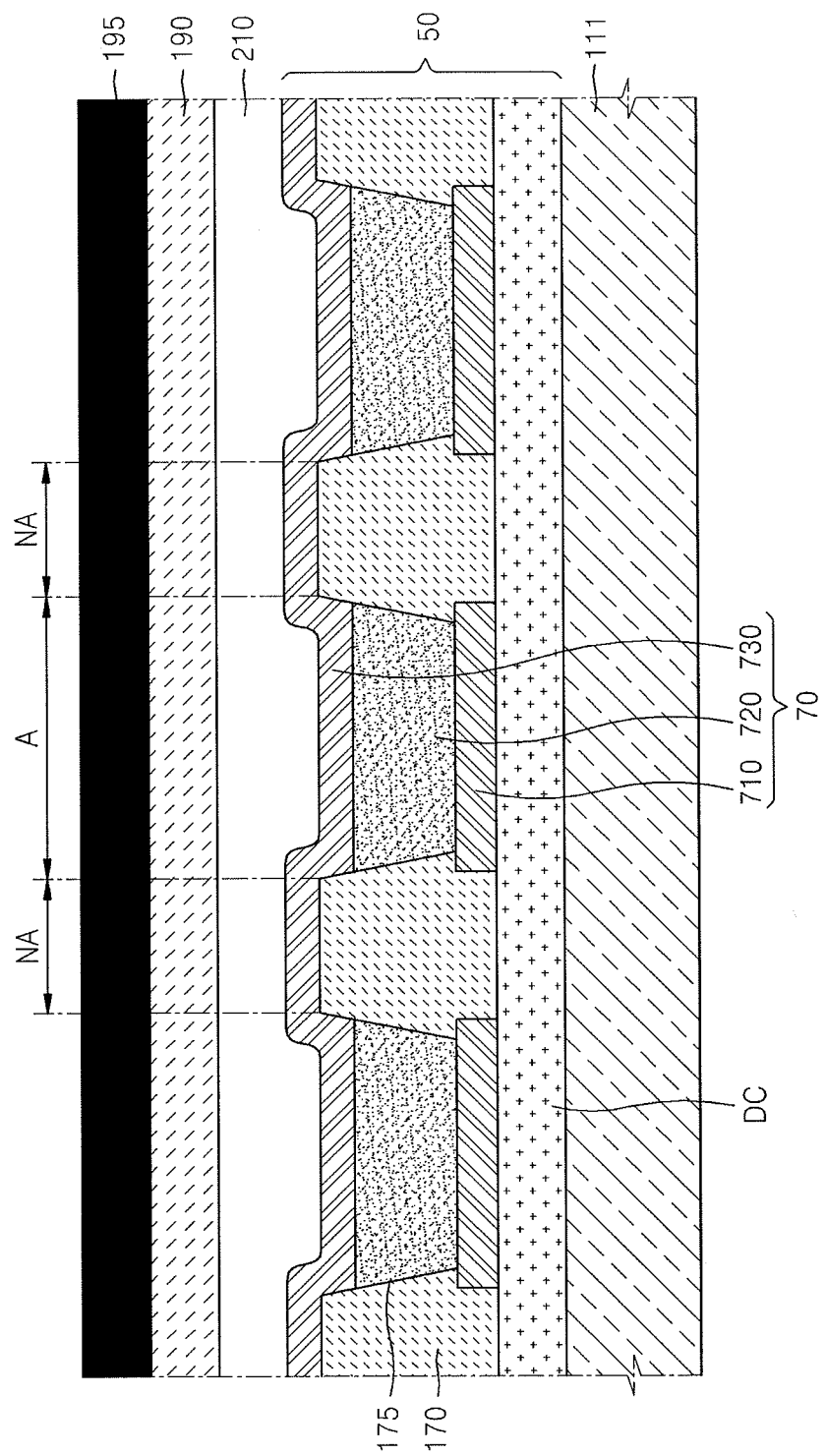
Figure 7C:
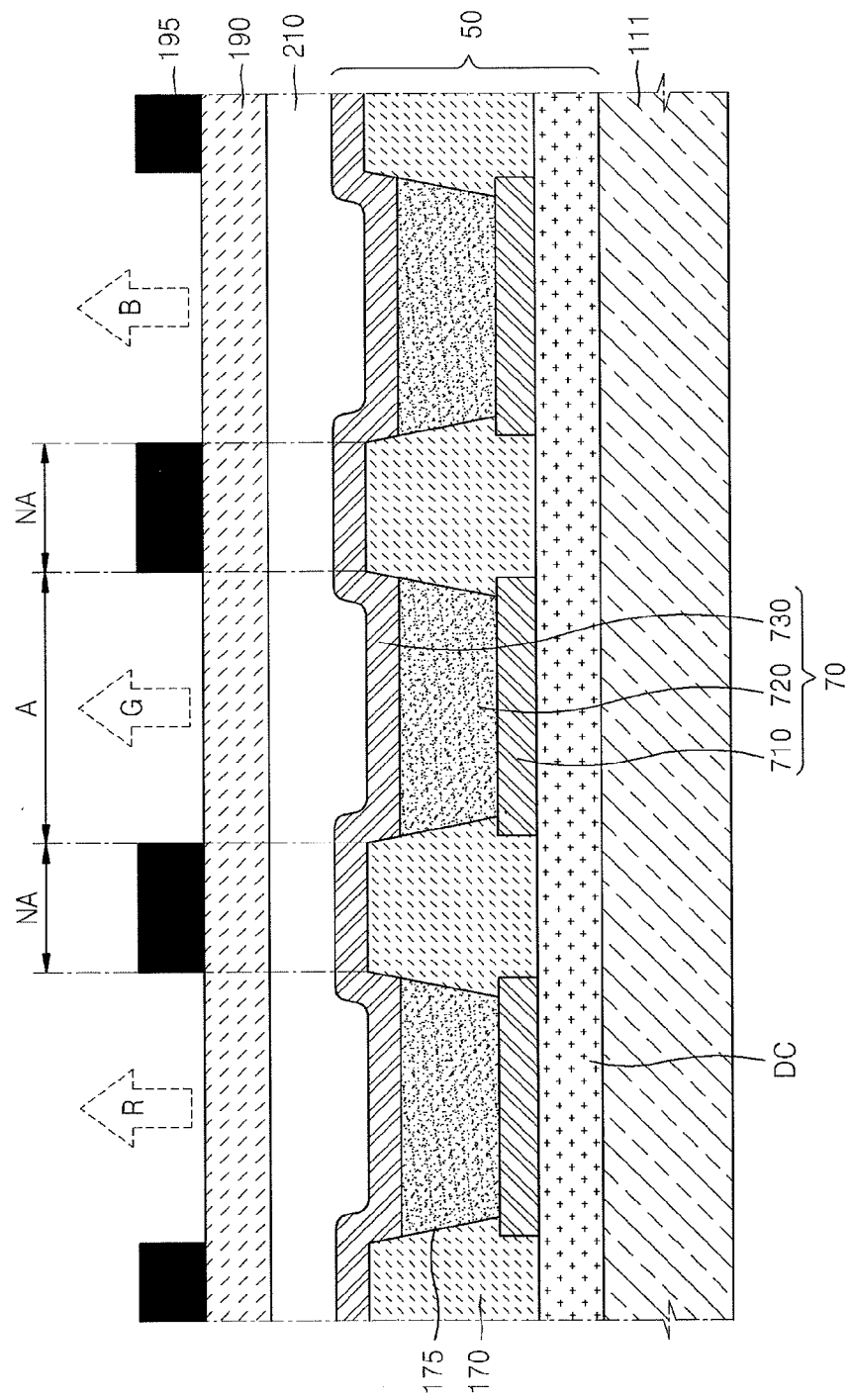

FIGS. 7A to 7C illustrate schematic cross-sectional views of stages of a method of manufacturing the display apparatus 101 of FIG. 1. As shown in FIG. 7A, the display unit 50 including the emission region A and the non-emission region NA may be formed on the substrate 111. Thereafter, the encapsulating layer 210 may be on the display unit 50. Next, as shown in FIG. 7B, the first metal oxide layer 190 and the second metal oxide layer 195 may be formed on the encapsulating layer 210. The first metal oxide layer 190 and the second metal oxide layer 195 may be formed by a sputtering process. The first metal oxide layer 190 and the second metal oxide layer 195 may be separately deposited using a same metal target under control of deposition conditions during sputtering deposition. For example, when Cu is a target, CuO or $Cu_2O$ may be separately deposited by controlling a quantity of oxygen. Thus, the first metal oxide layer 190 and the second metal oxide layer 195 may be formed in a same deposition process. Accordingly, process costs may be reduced. The transmissivity of the first metal oxide layer 190 may be adjusted by controlling deposition conditions during the sputtering deposition.

Next, as shown in FIG. 7C, the second metal oxide layer 195 may be patterned to correspond to the non-emission region NA. The second metal oxide layer 195 may be patterned in a photolithography process. In the photolithography process, when the second metal oxide layer 195 is etched after light exposure, for example, the etching may be performed only for the second metal oxide layer 195 by using an etching solution having etching selectivity on the second metal oxide layer 195 that may be different from that on the first metal oxide layer 190. The second metal oxide layer 195 may be patterned by laser ablation. The second metal oxide layer 195 is patterned on the first metal oxide layer 190. Accordingly, damage of the encapsulating layer 210 according to a patterning process may be reduced.

Figure 8A:
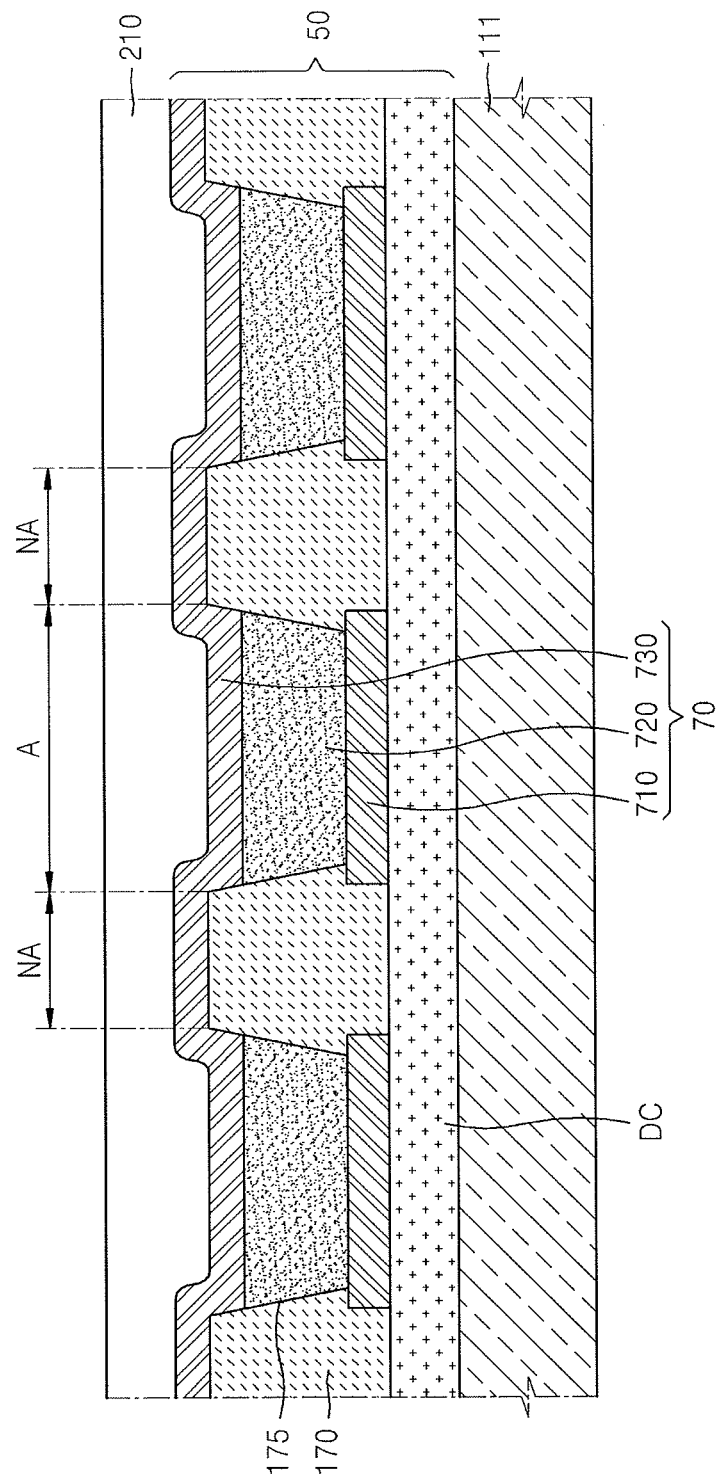
Figure 8B:
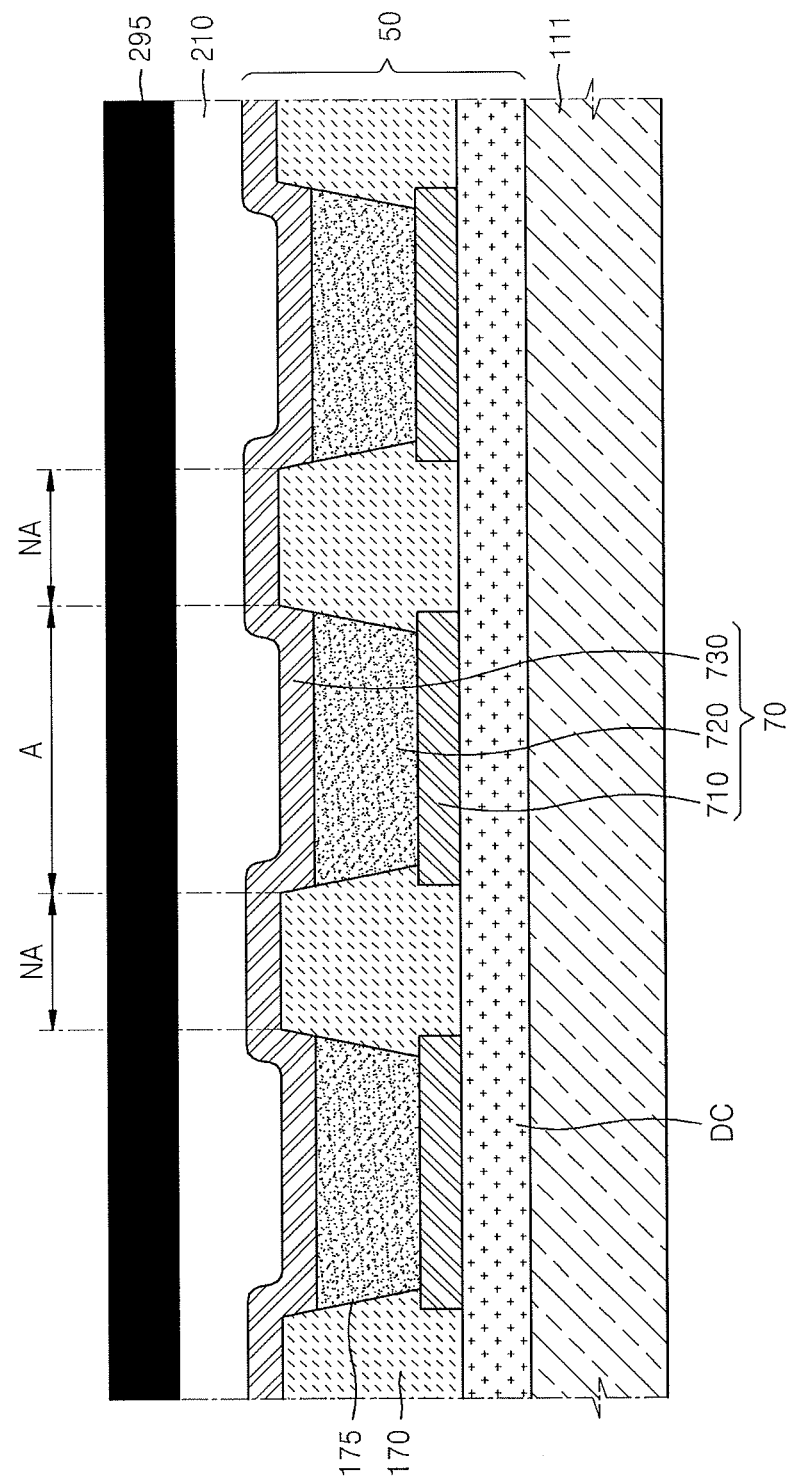
Figure 8C:
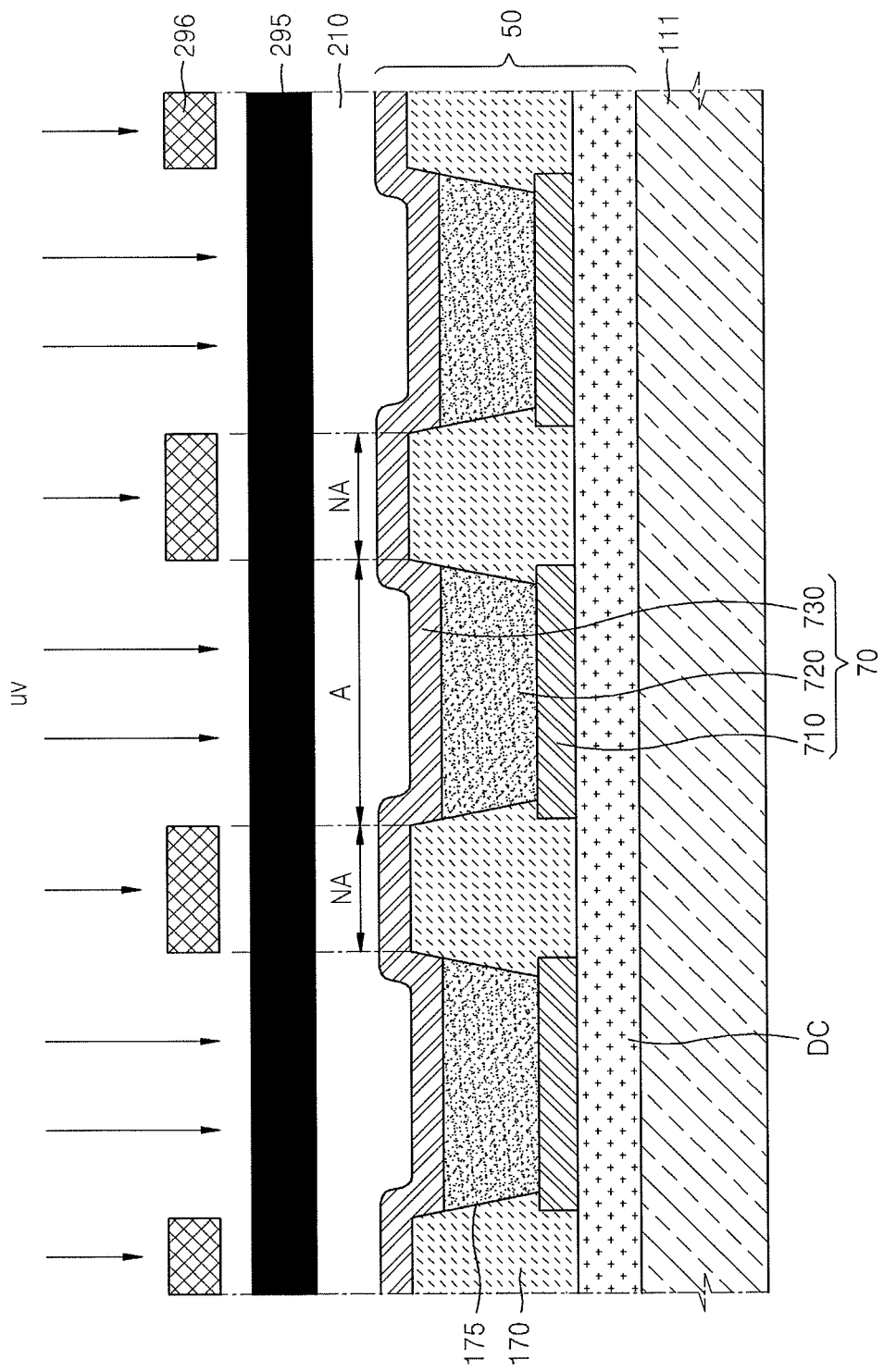

FIGS. 8A to 8D illustrate schematic cross-sectional views of stages of a method of manufacturing the display apparatus 201 of FIG. 4. As shown in FIG. 8A, the display unit 50 including the emission region A and the non-emission region NA may be formed on the substrate 111. Thereafter, the encapsulating layer 210 may be formed on the display unit 50. Next, as shown in FIG. 8B, the second metal oxide layer 195 may be formed on the encapsulating layer 210. After that, as shown in FIG. 8C, ultraviolet rays UV may be irradiated on a mask 296 patterned to correspond to the non-emission region NA. That is, the ultraviolet rays UV may be irradiated on the emission region A.

When the second metal oxide layer 295 includes CuO, CuO in a region on which the ultraviolet rays UV are irradiated may be transformed to $Cu_2O$ according to the property that if CuO is heated at a predetermined temperature or more, CuO is transformed to $Cu_2O$ by discharging oxygen therefrom. As shown in FIG. 8D, the first metal oxide layer 290 may be in the emission region A, and the second metal oxide layer 295 may be in the non-emission region NA.

With one deposition process and irradiation of ultraviolet rays UV, the first metal oxide layer 290 and the second metal oxide layer 295 may be patterned and formed, and thus, process costs may be reduced. The display apparatuses described herein may improve the recognition property by reducing the reflection of external light.

The metal oxide in the first and second metal oxide layers may differ with respect to the metal and/or the oxidation state. For example, the metal oxide in the first metal oxide layer may have a first oxidation state and the metal oxide in the second metal oxide layer may have a second oxidation state that differs from the first oxidation state. The same metal oxide having the same oxidation state may be present in both the first and second metal oxide layers. Different metal oxides having the same oxidation state may be present in both the first and second metal oxide layers. The ratio of one metal oxide to another metal oxide may differ between the first and second metal oxide layers. The ratio of one oxidation state to another oxidation state of a particular metal oxide may differ between the first and second metal oxide layers. The first metal oxide layer may include a first copper oxide (e.g., $Cu_2O$), and the second metal oxide layer may include a second copper oxide (e.g., CuO). The first and/or second metal oxide layers may include both first and second copper oxides, but in different ratios. For example, the first metal oxide layer may have a higher ratio of the first copper oxide to the second copper oxide, and/or the second metal oxide layer may have a higher ratio of the second copper oxide to the first copper oxide.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display apparatus, comprising:
a substrate;
a display unit including a first electrode, an intermediate layer on the first electrode, and a second electrode on the intermediate layer and including an emission region and a non-emission region, on the substrate;
a first metal oxide layer on the second electrode of the display unit; and
a second metal oxide layer on the first metal oxide layer only in the non-emission region,
wherein the first metal oxide layer and the second metal oxide layer each include a metal oxide, the transparency of which varies according to a degree of oxidization of the metal oxide.

2. The display apparatus as claimed in claim 1, wherein the first metal oxide layer is transparent, and the second metal oxide layer is opaque.

3. The display apparatus as claimed in claim 1, wherein the first metal oxide layer includes a copper oxide.

4. The display apparatus as claimed in claim 3, wherein the first metal oxide layer includes a first copper oxide represented by $Cu_2O$, and the second metal oxide layer includes a second copper oxide represented by $CuO$.

5. The display apparatus as claimed in claim 1, wherein the display unit includes a pixel defining layer having an opening portion, and the emission region corresponds to the opening portion.

6. The display apparatus as claimed in claim 1, wherein the display unit includes an organic light-emitting device (OLED) on the substrate.

7. The display apparatus as claimed in claim 6, wherein the display unit further includes a pixel defining layer having an opening portion, and the intermediate layer is in the opening portion.

8. The display apparatus as claimed in claim 1, further comprising an encapsulating layer directly on the display unit.

9. A display apparatus, comprising:
a substrate;
a display unit including a first electrode, an intermediated layer on the first electrode, and a second electrode on the intermediate layer and including an emission region and a non-emission region, on the substrate;
a first metal oxide layer on the second electrode of the display unit only in the emission region; and
a second metal oxide layer on the display unit only in the non-emission region,
wherein the first metal oxide layer and the second metal oxide layer include a metal oxide of which transparency varies according to a degree of oxidization.

10. The display apparatus as claimed in claim 9, wherein the first metal oxide layer is transparent, and the second metal oxide layer is opaque.

11. The display apparatus as claimed in claim 9, wherein the first metal oxide layer includes a copper oxide.

12. The display apparatus as claimed in claim 11, wherein the first metal oxide layer includes a first copper oxide represented by $Cu_2O$, and the second metal oxide layer includes a second copper oxide represented by $CuO$.

13. The display apparatus as claimed in claim 9, wherein the display unit includes a pixel defining layer having an opening portion, and the emission region corresponds to the opening portion.

14. The display apparatus as claimed in claim 9, wherein the display unit includes an organic light-emitting device (OLED) on the substrate.

15. The display apparatus as claimed in claim 14, wherein the display unit further includes a pixel defining layer having an opening portion, and the intermediate layer is in the opening portion.

16. The display apparatus as claimed in claim 9, further comprising an encapsulating layer directly on the display unit.

* * * * *